(12) United States Patent
Fredenburg et al.

(10) Patent No.: US 12,019,464 B2
(45) Date of Patent: Jun. 25, 2024

(54) DIGITAL SYSTEM SYNCHRONIZATION

(71) Applicant: Movellus Circuits Incorporated, Ann Arbor, MI (US)

(72) Inventors: Jeffrey Alan Fredenburg, Chicago, IL (US); Mohammad Faisal, San Francisco, CA (US); David Moore, Ann Arbor, MI (US); Yu Huang, Ann Arbor, MI (US)

(73) Assignee: Movellus Circuits Inc., Ann Arbor, MI (US)

( * ) Notice: Subject to any disclaimer, the term of this patent is extended or adjusted under 35 U.S.C. 154(b) by 122 days.

(21) Appl. No.: 17/552,318

(22) Filed: Dec. 15, 2021

(65) Prior Publication Data

US 2022/0200604 A1 Jun. 23, 2022

Related U.S. Application Data

(60) Provisional application No. 63/126,896, filed on Dec. 17, 2020, provisional application No. 63/149,766, filed on Feb. 16, 2021, provisional application No. 63/127,034, filed on Dec. 17, 2020, provisional application No. 63/127,040, filed on Dec. 17, 2020.

(51) Int. Cl.
| | |
|---|---|
| *G06F 1/10* | (2006.01) |
| *H01L 25/065* | (2023.01) |
| *H03L 7/00* | (2006.01) |
| *H03L 7/081* | (2006.01) |
| *H03L 7/083* | (2006.01) |
| *H03L 7/099* | (2006.01) |

(52) U.S. Cl.
CPC ............ *G06F 1/10* (2013.01); *H01L 25/0657* (2013.01); *H03L 7/00* (2013.01); *H03L 7/0816* (2013.01); *H03L 7/0818* (2013.01); *H03L 7/083* (2013.01); *H03L 7/0991* (2013.01); *H01L 2924/18161* (2013.01)

(58) Field of Classification Search
CPC ................... G06F 1/04–10; G06F 1/12; H03L 7/0814–0818
See application file for complete search history.

(56) References Cited

U.S. PATENT DOCUMENTS

| | | | | |
|---|---|---|---|---|
| 5,295,164 A | * | 3/1994 | Yamamura | H03L 7/0816 375/376 |
| 5,828,870 A | * | 10/1998 | Gunadisastra | H03L 7/089 713/401 |
| 6,232,806 B1 | * | 5/2001 | Woeste | H03L 7/0814 327/152 |
| 2005/0280407 A1 | * | 12/2005 | Loke | H03L 7/0816 327/158 |

(Continued)

*Primary Examiner* — Patrick O Neill
(74) *Attorney, Agent, or Firm* — Lance Kreisman; Peninsula Patent Group

(57) ABSTRACT

A semiconductor package includes source clock circuitry to generate a source clock signal. Reference clock circuitry generates a reference clock signal. A first timing circuit includes a first source clock input to receive the source clock signal. First fan-out circuitry distributes the received source clock signal as a first distributed clock signal to a first set of clocked devices. A first delay circuit delays the received source clock signal by a first delay value based on a first phase difference between the first distributed clock signal and the reference clock signal.

18 Claims, 6 Drawing Sheets

(56) References Cited

U.S. PATENT DOCUMENTS

| | | | | |
|---|---|---|---|---|
| 2011/0304371 A1* | 12/2011 | Ravi | ...................... | H03K 3/017 327/175 |
| 2015/0323959 A1* | 11/2015 | Arabi | ........................ | G06F 1/10 327/270 |
| 2016/0191062 A1* | 6/2016 | Shivaram | .................. | H03L 7/10 327/144 |
| 2022/0200611 A1* | 6/2022 | Faisal | ....................... | H03L 7/00 |

\* cited by examiner

DIGITAL SYSTEM SYNCHRONIZATION

CROSS-REFERENCE TO RELATED APPLICATIONS

This application is a Non-Provisional that claims priority to U.S. Provisional Application No. 63/126,896 filed Dec. 17, 2020, entitled FIELD PROGRAMMABLE CLOCK ARRAY, U.S. Provisional Application No. 63/149,766, filed Feb. 16, 2021, entitled FIELD PROGRAMMABLE CLOCK ARRAY, U.S. Provisional Application No. 63/127,034 filed Dec. 17, 2020, entitled LARGE-SCALE SYNCHRONOUS SYSTEMS, and U.S. Provisional Application No. 63/127,040, filed Dec. 17, 2020, entitled POST-SILICON CLOCK DISTRIBUTION MEASUREMENT CIRCUITRY, all of which are incorporated herein by reference in their entirety.

TECHNICAL FIELD

The disclosure herein relates to digital systems, subsystems, integrated circuits, and associated methods.

BRIEF DESCRIPTION OF THE DRAWINGS

Embodiments of the disclosure are illustrated by way of example, and not by way of limitation, in the figures of the accompanying drawings and in which like reference numerals refer to similar elements and in which.

DETAILED DESCRIPTION

Digital systems, subsystems, integrated circuits, and associated methods are disclosed. In one embodiment, a semiconductor package includes source clock circuitry to generate a source clock signal. Reference clock circuitry generates a reference clock signal. A first timing circuit includes a first source clock input to receive the source clock signal. First fan-out circuitry distributes the received source clock signal as a first distributed clock signal to a first set of clocked devices. A first delay circuit delays the received source clock signal by a first delay value based on a first phase difference between an arrival time of the first distributed clock signal and the reference clock signal. By employing a common reference clock signal to multiple subsystems, an efficient and low-power way to align multiple subsystem clocks may be realized without the need for costly clock-domain crossing (CDC) circuits.

Figure 1:
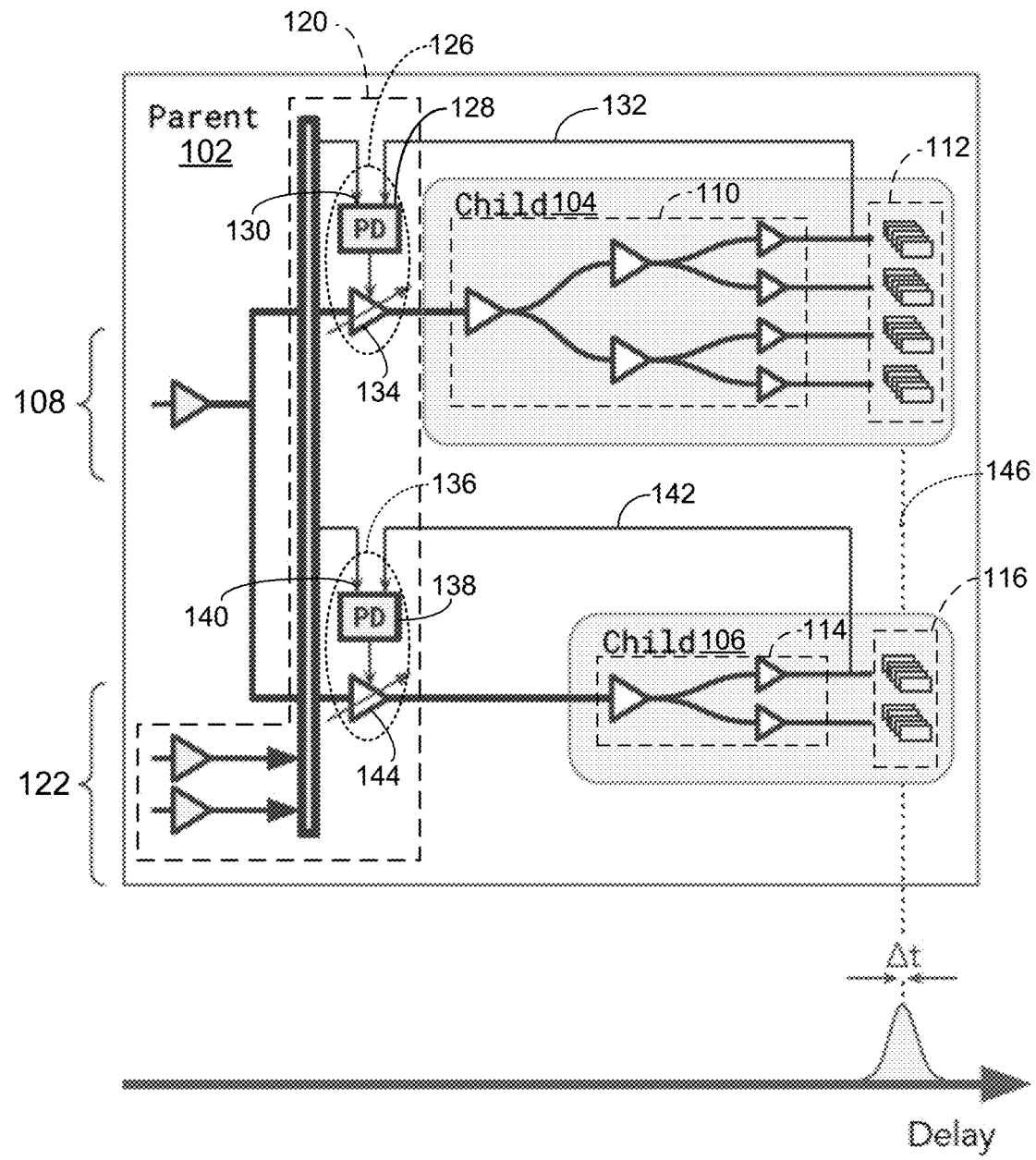
FIG. 1 illustrates one embodiment of a parent digital system that employs child sub-systems and a common reference clock.

With reference to FIG. 1, a digital "parent" system is illustrated, generally designated 102, that includes multiple "child" subsystems 104 and 106. For various embodiments, the subsystems may be realized as separate circuits within a single monolithic design, separate chiplets assembled within a single integrated circuit (IC) package (such as for a system-on-chip, or SoC), separate packages assembled on a printed circuit board (PCB), or separate PCBs within a large scale system.

Further referring to FIG. 1, the parent system 100 includes a source clock 108 to generate a source clock signal for use by the multiple child subsystems 104 and 106. The first child subsystem 104 employs a first clock tree distribution network, such as at 110, to fan-out a first received version of the source clock signal to a first set of one or more clocked devices 112. In a similar manner, the second child subsystem 106 employs a second clock tree distribution network, such as at 114, to fan-out a second received version of the source clock signal to a second set of one or more clocked devices 116.

With continued reference to FIG. 1, to ensure that the respective first and second sets of clocked devices 112 and 116 receive respective versions of the source clock signal at an aligned arrival time, phase compensation circuitry 120 is provided. Generally, the phase compensation circuitry 120 counteracts or compensates for a variety of design and silicon-related effects, such as the depth of the respective clock trees 110 and 106, or process, voltage or temperature (PVT) characteristics that may affect the respective subsystems 104 and 106 differently. As more fully described below, the phase compensation circuitry 120 is of a straightforward design that enables the respective subsystems 104 and 106 to synchronize with the parent system 102 without use of complex and power hungry clock domain crossing (CDC) circuitry.

Further referring to FIG. 1, one embodiment of the phase compensation circuitry 120 employs a reference clock 122 to generate a highly accurate reference clock signal. The reference clock signal is distributed across the parent system 102 via a common bus. To align a reference edge of the reference clock signal with a first arrival time of the source clock signal (as received by the first set of clocked devices 112 of the first subsystem 104), a first phase alignment circuit 126 is disposed between the source clock 108 and the input of the first clock tree 110. The first alignment circuit includes a first phase detector 128 that receives the reference clock signal, at 130, and a version of the arrived source clock fed to the first set of multiple devices 112 along a first feedback path 132. The first phase detector 128 detects a first phase difference between an edge of the reference clock signal and an edge of the first arrived source clock signal to generate a first phase difference signal. A first variable delay circuit 134 receives the first phase difference signal and delays the source clock to the input of the first clock tree 110 based on the first phase difference signal. For one embodiment, the first phase difference signal is binary, with a first value to indicate that a decrease in the delay should be applied, and a second value to indicate that an increase in the delay should be applied.

With continued reference to FIG. 1, a second phase alignment circuit 136 is disposed between the source clock 108 and the input of the second clock tree 114. The second phase alignment circuit 136 is formed similar to the first phase alignment circuit 126 and includes a second phase detector 138 that receives the reference clock signal, at 140, and a version of the arrived source clock (from the perspective of the second subsystem 106) fed to the second set of multiple devices 116 along a second feedback path 142. The second phase detector 128 detects a second phase difference between an edge of the reference clock signal and an edge of the second arrived source clock signal to generate a second phase difference signal. A second variable delay circuit 144 receives the second phase difference signal and delays the source clock to the input of the second clock tree 114 based on the second phase difference signal.

Further referring to FIG. 1, by separately delaying the two source clock signals based on separate phase differences involving the reference clock signal and "arrived" versions of the separate source clock signals, the relative phases of the two arrived versions of the source clock signal become aligned, at 146, representing the timing boundary where the separate sets of clocked devices receive their respective clock signals, and thus can communicate in a synchronous fashion.

Figure 2:
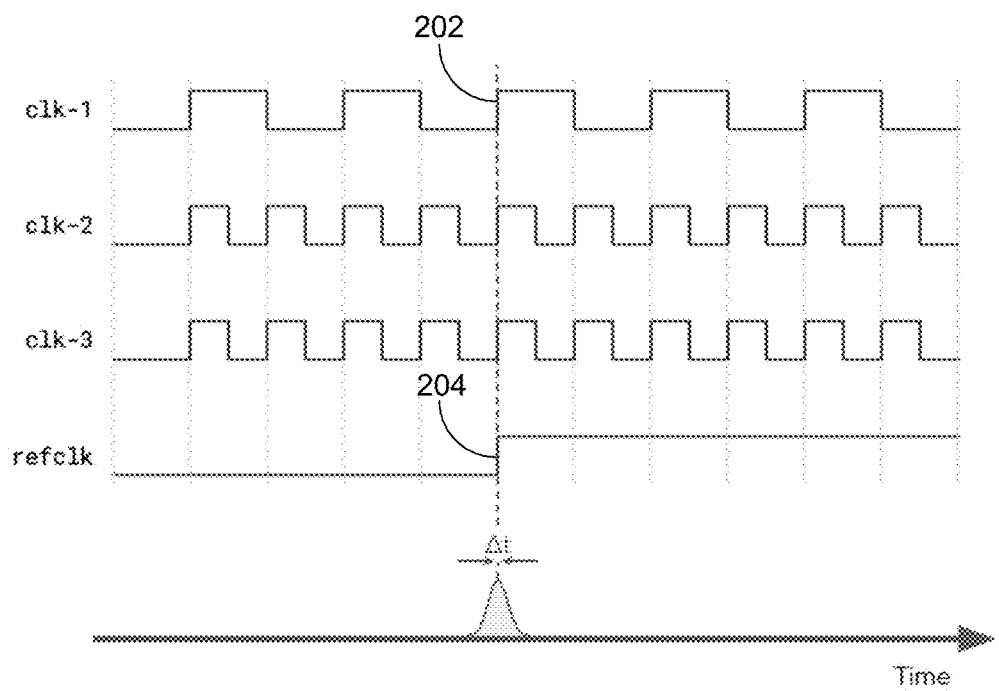
FIG. 2 illustrates representative synchronized clock signals associated with the system shown in FIG. 1.

FIG. 2 illustrates multiple clock signals, clk-1, clk-2,and clk-3 that represent multiple arrival clock signals similar to those used for the first and second subsystems of FIG. 1. A reference clock signal waveform refclk is also shown that corresponds to the reference clock signal of FIG. 1. While not required, the clock signals may generally be harmonics of one another. By aligning an edge (such as the rising edge) of each arrival clock signal, such as at 202, with an edge (such as the rising edge) of the commonly distributed reference clock signal, shown at 204, any clock skew between the arrival clocks of the respective subsystems is effectively eliminated, resulting in synchronously tuned clock signals.

Further referring to FIG. 2, for one embodiment, the reference clock signal refclk exhibits an edge rate that is lower than the edge rates of the arrival clock signals. Employing a reduced edge rate for the reference clock refclk generally results in a correspondingly reduced level of power dissipation by the reference clock circuitry. For one embodiment, the reference clock edge rate may be minimized to a level corresponding to a minimum rate of alignment adjustments. Thus, edges provided by the reference clock may be generated in an on-demand manner so as to minimize power consumption even further. For some embodiments, the reference clock edge rate may be adaptively increased or decreased in concert with a temporary increase/decrease in the digital system operating bandwidth.

Figure 3:
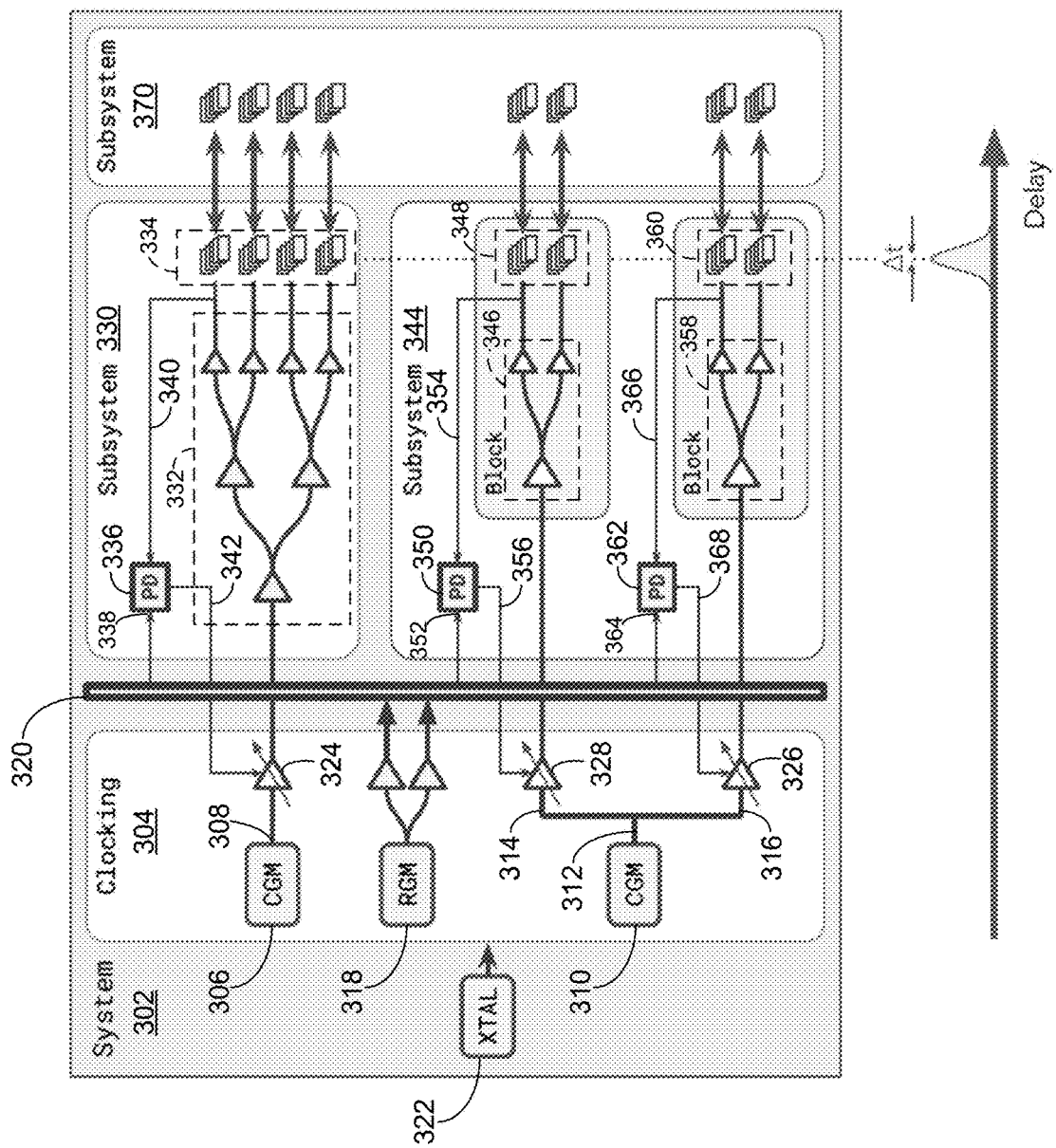
FIG. 3 illustrates further detail for one embodiment of a system using a common clocking subsystem.

FIG. 3 illustrates a further embodiment of a digital system, generally designated 302, that is similar to the general architecture shown in FIG. 1. For one embodiment, the digital system 302 may be partitioned into a common clocking subsystem 304 that synchronizes clock arrival times for multiple subsystems 330, 344, 366 and 370. The common clocking subsystem 304 includes a first clock generating module 306 that generates a first source clock signal, at 308, for application to the first subsystem 330. A second clock generating module 310 generates a second source clock signal, at 312, for application to the second subsystem 344. As shown in FIG. 3, the output of the second clock generating module 310 may be fed along multiple paths 314 and 316 to eventually provide separate copies of the second source clock signal for separate clock trees of the second subsystem 344.

Further referring to FIG. 3, the common clocking subsystem 304 also includes a reference clock generation module 318 to create a reference clock signal for distribution to the first and second subsystems 330 and 344 via a reference clock bus 320. For one embodiment, the source clock generation modules 306, 310, and the reference clock generation module 318 take the form of frequency multiplier circuits, such as phase-locked loops (PLLs) to generate high-frequency clocks from, for example, a crystal oscillator 322. For one embodiment, the common clocking subsystem 304 employs variable delay circuits 324, 326 and 328 at the output of each of the source clock modules 306 and 310.

With continued reference to FIG. 3, the first subsystem 330 is formed similarly to the subsystems of FIG. 1, including a first clock tree distribution network, such as at 332, to fan-out a first received version of the source clock signal to a first set of one or more clocked devices 334. A first local phase detector 336 resides in the first subsystem 330 and receives the reference clock signal, at 338, and a version of the arrived source clock fed to the first set of multiple devices 334 along a first feedback path 340. The first local phase detector 336 detects a first phase difference between an edge of the reference clock signal and an edge of the first arrived source clock signal to generate a first phase difference signal. The first phase difference signal is fed via path 342 off the first subsystem 330 to the clocking subsystem 304 for receipt by the first variable delay circuit 324. The first variable delay circuit 324 then delays the source clock to the input of the first clock tree 332 of the first subsystem 330 based on the first phase difference signal.

Further referring to FIG. 3, similarly to the first subsystem 330, the second subsystem 344 employs a second clock tree distribution network, such as at 346, to fan-out a second received version of the source clock signal to a second set of one or more clocked devices 348. A second local phase detector 350 resides in the second subsystem 344 and receives the reference clock signal, at 352, and a version of the arrived source clock fed to the second set of multiple devices 348 along a second feedback path 354. The second local phase detector 350 detects a second phase difference between an edge of the reference clock signal and an edge of the second arrived source clock signal to generate a second phase difference signal. The second phase difference signal is fed via path 356 off the second subsystem 344 to the clocking subsystem 304 for receipt by the second variable delay circuit 328. The second variable delay circuit 328 then delays the source clock to the input of the second clock tree 346 of the second subsystem 344 based on the second phase difference signal.

With continued reference to FIG. 3, as explained above, the second subsystem 344 may be further partitioned to include a third clock tree distribution network, such as at 358, to fan-out a third received version of the source clock signal to a third set of one or more clocked devices 360. A third local phase detector 362 resides in the sub-partitioned second subsystem 344 and receives the reference clock signal, at 364, and a version of the arrived source clock fed to the third set of clocked devices 360 along a third feedback path 366. The third local phase detector 362 detects a third phase difference between an edge of the reference clock signal and an edge of the third arrived source clock signal to generate a third phase difference signal. The third phase difference signal is fed via path 368 off the second subsystem 344 to the clocking subsystem 304 for receipt by the third variable delay circuit 326. The third variable delay circuit 326 then delays the source clock to the input of the third clock tree 358 of the sub-partitioned second subsystem 344 based on the third phase difference signal.

Further referring to FIG. 3, with the source clock arrival times of the first and second subsystems 330 and 344 aligned with the common reference clock, they are generally also aligned with each other, and thus synchronous. As a result, a further common subsystem including clocked devices may communicate synchronously with the first, second and third sets of clocked devices 334, 348 and 360 of the first and second subsystems 330 and 344 without the need for complex and power hungry clock domain crossing circuits.

The digital systems described above with respect to FIGS. 1-3 lend themselves well to a variety of system applications ranging from circuitry on a single integrated circuit (IC) chip, to multiple chiplets packaged as a system-on-chip (SoC), to multiple chips mounted on a printed circuit board, and scaleable to multiple synchronized printed circuit boards. Examples of these varied embodiments are described below and shown in FIGS. 4-6.

Figure 4:
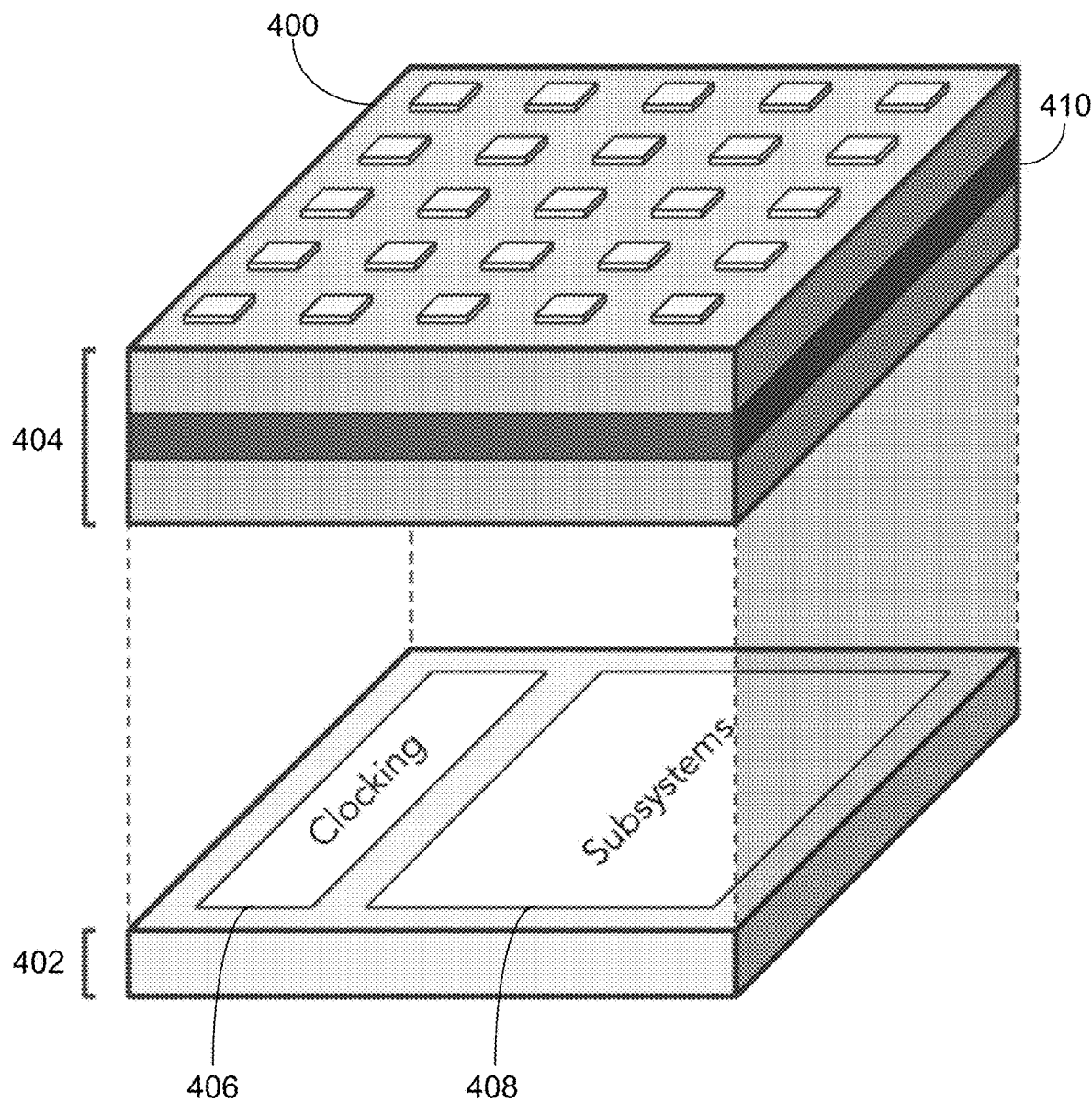
FIG. 4 illustrates one embodiment of a monolithic integrated circuit die that employs the system of FIG. 3.

FIG. 4 illustrates one embodiment of a semiconductor package in the form of a single monolithic integrated circuit (IC) die or chip 400 that is formed with the circuitry shown in FIG. 3. The IC die 400 generally includes a silicon layer 402 and a stack of metal layers 404. A clocking subsystem circuit 406 (corresponding to the common clocking subsystem 304 of FIG. 3) is formed in a first portion of the IC die 400, while one or more other subsystems 408 may be formed in another portion of the IC die 400. For one embodiment, a reference clock distribution network (corresponding to the reference clock bus 320 of FIG. 3) is formed in at least one of the metal layers, such as at 410, of the metal layer stack 404. In this manner, separately partitioned subsystems formed in different portions of the IC die 400 may have the reference clock distributed efficiently for synchronization purposes.

Figure 5:
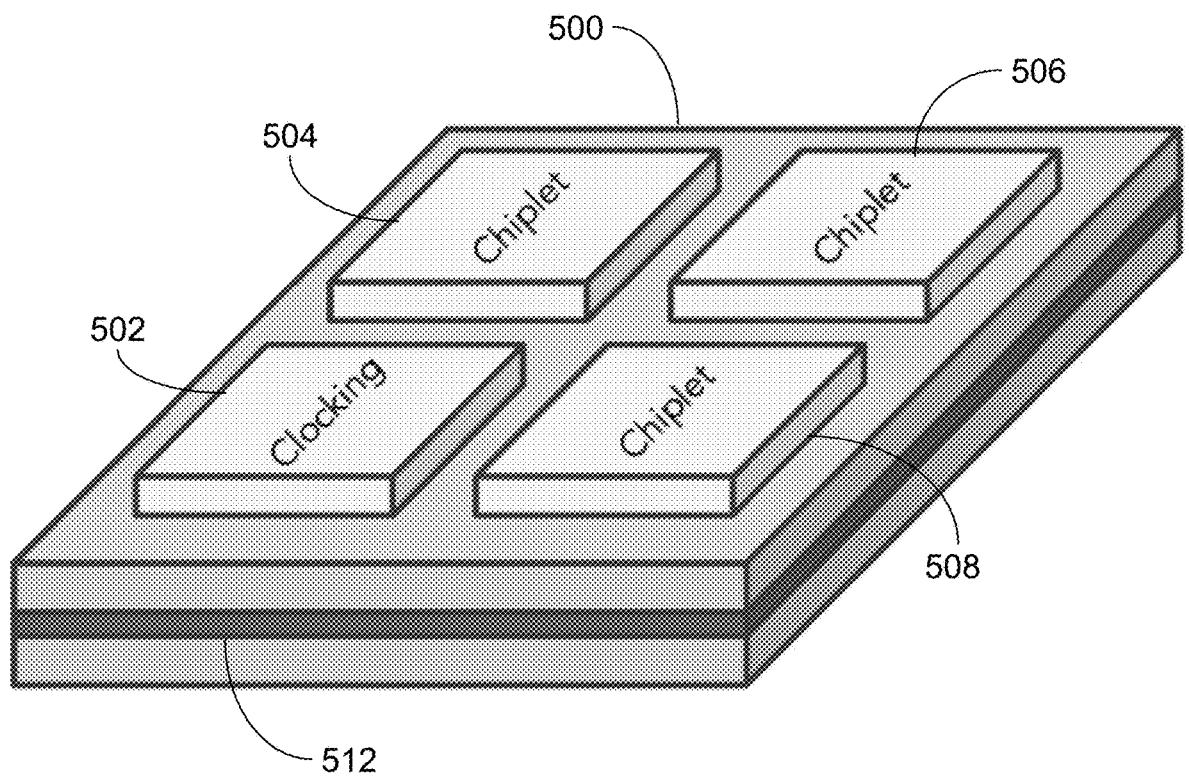
FIG. 5 illustrates a further embodiment of a synchronized system including separate chiplets within a single integrated circuit package.

In a further embodiment, shown in FIG. 5, the circuitry of FIG. 3 may be incorporated in a semiconductor package 500 that takes the form of multiple IC chips 502, 504, 506 and 508, often referred to as "chiplets", that may be disposed on a common substrate 510 to form a system-on-chip (SoC) device. For one embodiment, the first chiplet 502 may include circuitry corresponding to the common clocking subsystem 304 of FIG. 3, while the other chiplets 504, 506 and 508 may include circuitry corresponding to a separately partitioned subsystem of FIG. 3 that receives one of the clock source signals and the reference clock signal from the common clocking subsystem 304. For one embodiment, the common substrate 510 incorporates at least one metal layer, such as at 512, in the form of a redistribution layer (RDL) to distribute the reference clock signal to the other chiplets 504, 506 and 508.

Figure 6:
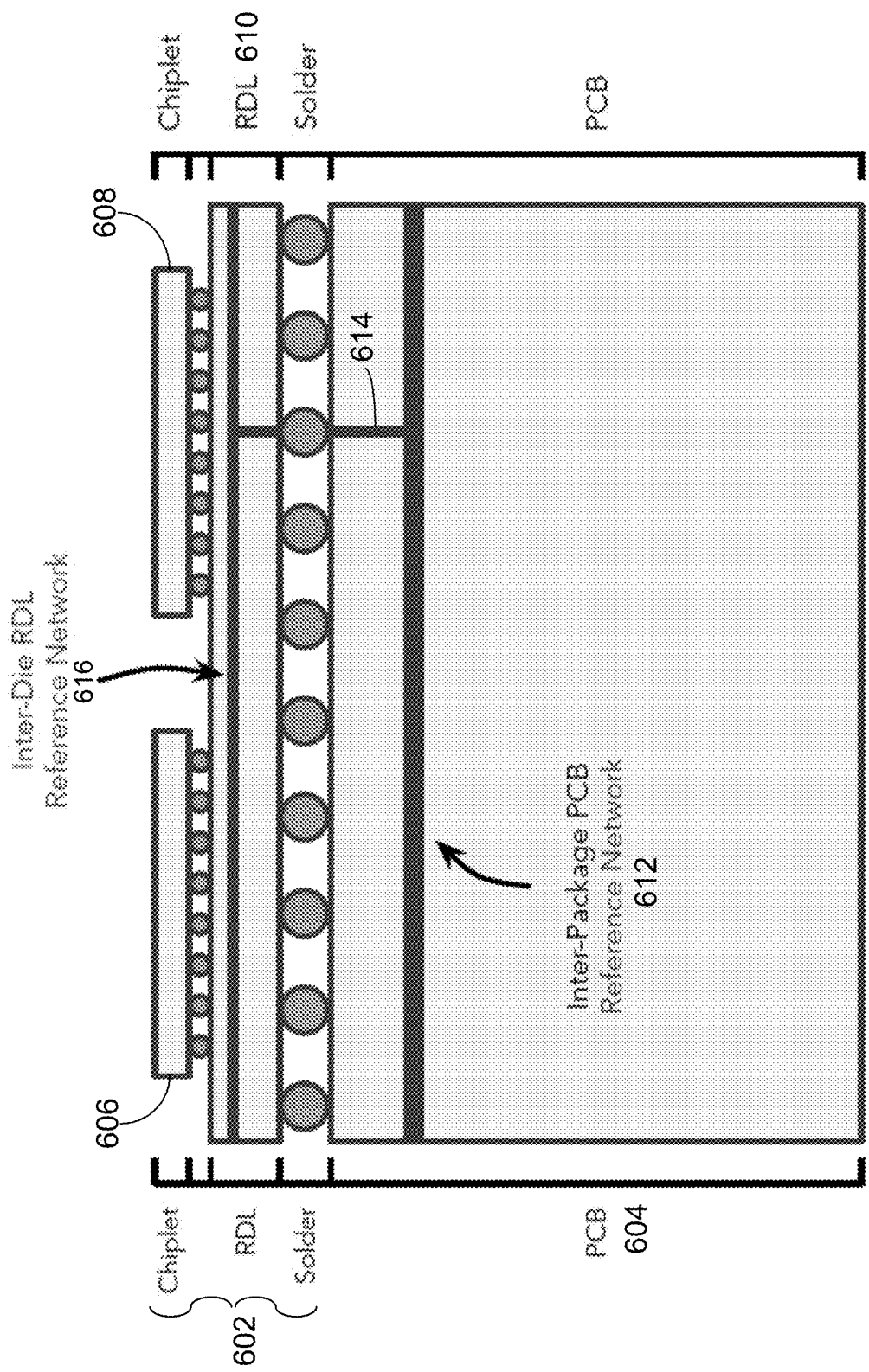
FIG. 6 illustrates a further embodiment of a system of separate IC packages deployed on a printed circuit board (PCB).

In yet another embodiment, and referring now to FIG. 6, the system architecture of FIG. 3 may be realized by one or more IC components 602 disposed on one or more printed circuit boards (PCBs) 604. The IC component 602 may be formed similarly to the chiplet SoC 400 of FIG. 4, including multiple chiplet subsystems 606 and 608 on a common RDL substrate 610. The IC component 602 may be bonded to the PCB 604 via one of a variety of packaging technologies. For one embodiment, a reference clock network is formed in one or more metal routing layers (such as at 612) in the PCB 604 to supply a reference clock signal to a package via interconnect, at 614, and fed to a layer 616 of the RDL 610 for distribution to the various chiplets 606 and 608.

Those skilled in the art will appreciate that the architecture described above enables the synchronization of separately partitioned digital subsystems to be efficiently synchronized without the need for complex and power hungry clock domain crossing circuitry.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. A semiconductor package, comprising:
source clock circuitry to generate a first source clock signal of a first frequency that corresponds to a first edge rate and a second source clock signal of a second frequency that is harmonic of the first frequency;
reference clock circuitry to generate a reference clock signal having a second edge rate that is different than the first edge rate;
a first timing circuit including
a first source clock input to receive the first source clock signal;
first fan-out circuitry to distribute the received first source clock signal as a first distributed clock signal to a first set of clocked devices;
a first delay circuit to delay the received first source clock signal by a first delay value based on a first phase difference between the first distributed clock signal and the reference clock signal; and
a second timing circuit including
a second source clock input to receive the second source clock signal;
second fan-out circuitry to distribute the received second source clock signal as a second distributed clock signal to a second set of clocked devices; and
a second delay circuit to delay the received second source clock signal by a second delay value based on a second phase difference between the second distributed clock signal and the reference clock signal.

2. The semiconductor package of claim 1, further comprising:
a phase detector to detect the first phase difference.

3. The semiconductor package of claim 2, wherein the phase detector comprises:
a first input to receive the reference clock signal;
a second input to receive the first distributed clock signal from a feedback path; and
an output to generate a signal indicative of a phase difference between the first distributed clock signal and the reference clock signal.

4. The semiconductor package of claim 2, wherein:
the second edge rate is less than the first edge rate.

5. The semiconductor package of claim 1, wherein:
the second delay value is free to be different than the first delay value.

6. The semiconductor package of claim 1, realized as a packaged integrated circuit (IC) chip.

7. The semiconductor package of claim 1, realized as multiple chiplets housed in a single integrated circuit (IC) package.

8. The semiconductor package of claim 7, further comprising:
a printed circuit board (PCB) substrate; and
wherein the single integrated circuit package is mounted to the PCB substrate.

9. A digital system, comprising:
source clock circuitry including a first source clock to generate a first source clock signal of a first frequency corresponding to a first edge rate and a second source clock to generate a second source clock signal at a second frequency that is a harmonic of the first frequency;
reference clock circuitry to generate a reference clock signal having a reference edge rate that is different than the first edge rate;
a first timing circuit including
a first source clock input to receive the first source clock signal;
first fan-out circuitry to distribute the received first source clock signal as a first distributed clock signal to a first set of clocked devices;
a first delay circuit to delay the received first source clock signal by a first delay value based on a first phase difference between the first distributed clock signal and the reference clock signal;
a second timing circuit including
a second source clock input to receive the second source clock signal;
second fan-out circuitry to distribute the received second source clock signal as a second distributed clock signal to a second set of clocked devices; and
a second delay circuit to delay the received second source clock signal by a second delay value based on a second phase difference between the second distributed clock signal and the reference clock signal.

10. The digital system of claim 9, wherein:
the second delay value is free to be different than the first delay value.

11. The digital system of claim 9, wherein:
the reference edge rate is less than the first edge rate.

12. The digital system of claim 9, wherein the first source clock, the second source clock, and the reference clock circuitry comprise respective frequency multiplier circuits.

13. The digital system of claim 9, further comprising:
a crystal oscillator to generate a global clock signal; and
wherein the first source clock signal, the second source clock signal and the reference clock signal are derived from the global clock signal.

14. The digital system of claim 9, realized as a packaged integrated circuit (IC) chip.

15. The digital system of claim 9, realized as multiple chiplets housed in a single integrated circuit (IC) package.

16. The digital system of claim 15, further comprising:
a printed circuit board (PCB) substrate; and
wherein the single integrated circuit package is mounted to the PCB substrate.

17. A method of synchronizing a first digital subsystem to a second digital subsystem in a digital system, the method comprising:
feeding a first source clock signal to the first digital subsystem;
distributing the first source clock signal to a first set of clocked devices via a first clock-tree network, the first source clock signal arriving at the first set of multiple clocked devices as a first arrival clock signal exhibiting a first clock phase;
feeding a second source clock signal to the second digital subsystem;
distributing the second source clock signal to a second set of clocked devices via a second clock-tree network, the second source clock signal arriving at the second set of multiple clocked devices as a second arrival clock signal exhibiting a second clock phase; and
aligning the first clock phase to the second clock phase by applying a common reference clock signal exhibiting a reference clock phase to the first subsystem and the second subsystem;

comparing the first clock phase to the reference clock phase to generate a first phase difference signal, and comparing the second clock phase to the reference clock phase to generate a second phase difference signal;

phase shifting the first source clock signal by a first phase-offset based on the first phase difference signal; and phase shifting the second source clock signal by a second phase-offset based on the second phase difference signal.

18. The method of claim 17, wherein:

the second phase offset is free to be different than the first phase offset.

\* \* \* \* \*